United States Patent
Birkhofer et al.

(10) Patent No.: US 7,702,774 B2
(45) Date of Patent: Apr. 20, 2010

(54) METHOD FOR OPERATING AN OBJECT-BASED CONFIGURATION SYSTEM FOR FIELD DEVICES OF AUTOMATION TECHNOLOGY

(75) Inventors: Rolf Birkhofer, Karlsruhe (DE); Immanuel Vetter, Sinzheim (DE)

(73) Assignee: CodeWrights GmbH, Karlsruhe (DE)

( * ) Notice: Subject to any disclaimer, the term of this patent is extended or adjusted under 35 U.S.C. 154(b) by 23 days.

(21) Appl. No.: 12/000,935

(22) Filed: Dec. 19, 2007

(65) Prior Publication Data

US 2008/0288613 A1    Nov. 20, 2008

(51) Int. Cl.
G06F 15/177 (2006.01)
(52) U.S. Cl. ..................... 709/223
(58) Field of Classification Search .......... 709/220–223
See application file for complete search history.

(56) References Cited

U.S. PATENT DOCUMENTS

| | | | | |
|---|---|---|---|---|
| 6,298,377 | B1* | 10/2001 | Hartikainen et al. | 709/223 |
| 2003/0005090 | A1* | 1/2003 | Sullivan et al. | 709/220 |
| 2003/0069955 | A1* | 4/2003 | Gieseke et al. | 709/223 |
| 2003/0074429 | A1* | 4/2003 | Gieseke et al. | 709/221 |
| 2003/0176940 | A1* | 9/2003 | Rangachari et al. | 700/121 |
| 2004/0162841 | A1* | 8/2004 | Bernstein et al. | 707/100 |
| 2007/0078956 | A1* | 4/2007 | VanGompel | 709/220 |

* cited by examiner

*Primary Examiner*—Salad Abdullahi
(74) *Attorney, Agent, or Firm*—Bacon & Thomas, PLLC

(57) ABSTRACT

A method for operating an object-based configuration system CS for field devices of automation technology, with a frame application FA, which serves for managing and instantiating a plurality of objects, wherein, to individual groups of device objects, field device types are assigned, which enable, as device managers, a configuration of the corresponding field device type. A first main object MO-1 is provided, which makes available a first object set OS-1 with device objects for a plurality of device types and instantiates, with the help of a first control engine, via an identifier ID, device objects of the first object set, in order to produce device managers for these field device types. Besides the first main object MO-1, a second main object MO-2 is provided, which has a second object set OS-2, wherein individual device objects of the second object set OS-2 are updated device objects of the first object set OS 1. Between the frame application FA and the main object(s) MO-1, MO-2, respectively, an intermediate layer I is provided, which selects, via a second control engine, that main object, which makes available the updated device objects for the selected device type, and which, following selection of the device type, transfers to the corresponding main object the identifier ID, in order to instantiate the updated device object.

4 Claims, 4 Drawing Sheets

Modular structure before software change

METHOD FOR OPERATING AN OBJECT-BASED CONFIGURATION SYSTEM FOR FIELD DEVICES OF AUTOMATION TECHNOLOGY

TECHNICAL FIELD

The invention relates to a method for operating an object-based configuration system for field devices of automation technology, with a frame structure serving for managing and instantiating a plurality of objects, wherein to individual groups of device-objects are assigned field device types, which enable as device managers, a configuration of a corresponding field device type.

BACKGROUND DISCUSSION

Field devices are commonly employed in automation technology (process automation/manufacturing automation) and serve for registering and/or influencing process variables. Examples of such field devices are fill level measuring devices, mass flow measuring devices, pressure- and temperature-measuring devices, pH- and redox-potential-measuring devices, conductivity measuring devices, etc. for process automation technology, which, as sensors, register the corresponding process variables, fill level, flow, e.g. flow rate, pressure, temperature, pH-value and conductivity value, respectively.

Serving for influencing process variables are actuators, e.g. valves, which control flow of a liquid in a section of pipeline, or pumps, which change fill level in a container.

A large number of such field devices are manufactured and sold by the firm ENDRESS+HAUSER®.

Frequently, field devices are connected with superordinated units via communication systems (PROFIBUS®, FOUNDATION-FIELDBUS®, HART®, etc.). Such superordinated units serve for process control, process visualization, device-management (configuration and servicing) and for plant management (asset management), using corresponding application programs.

The integration of field devices into such applications occurs via device descriptions. Device descriptions are provided by device manufacturers, in order that superordinated units can recognize and interpret the meaning of data supplied by the field devices.

Various device descriptions are known for the different fieldbus systems (HART-device-descriptions, Fieldbus Foundation device descriptions, Profibus device descriptions).

On the basis of cooperation of Fieldbus Foundation (FF), HART Communication Foundation (HCF) and Profibus Nutzerorganisation (PNO), an electronic device description (Electronic Device Description EDD) was created, which is defined in the standard IEC 61804-2.

With a large number of EDD-based fieldbus systems installed worldwide, EDD is a very widely used description language for device descriptions in automation technology.

For servicing field devices, corresponding servicing programs (operating tools) are necessary, which, in superordinated units, run either on their own (Endress+Hauser FieldCare, Pactware, AMS Fisher-Rosemount, PDM Siemens) or else are integrated into control system applications (Siemens PCS7, ABB Symphony, Emerson Delta V).

For a comprehensive servicing of field devices, newly, special device descriptions, so-called DTMs (Device Type Manager), are available, which correspond to the FDT (Field Device Tool) specifications. The FDT-specifications, serving as an industry standard, were developed by the PNO (Profibus Nutzer Organisation (Profibus User Organization)) in cooperation with ZVEI (Zentralverband Elektrotechnik-und Elektroindustrie (The German Electrical and Electronics Industry, a registered association)). The current FDT-Specification 1.2.1, including the Addendum for "Foundation Fieldbus" Communication, is available from ZVEI, PNO or the FDT-Group.

Many field device manufacturers already deliver corresponding DTMs for their field devices. The DTMs encapsulate all variables and functions of the pertinent field device and offer, most often, a graphical user interface for servicing the devices.

As run-time environment, the DTMs require a frame application (FDT-frame). The frame application and the corresponding DTMs permit, thus, a very comfortable access to field devices (e.g. to device parameters, measured values, diagnostic information, status information, etc.), as well as for invoking special functions, which individual DTMs make available.

The DTMs can be referred to as device objects, which, together with the frame application, represent an object-oriented configuration system for field devices of automation technology.

In order to keep the administration of device objects as simple as possible in superordinated units, the field-device manufacturers do not provide a separate DTM for each field device, but, instead, a main, or principal, object, which includes a plurality of device objects for individual field device types of the particular manufacturer.

If a malfunction occurs during the servicing of a field device, then the corresponding device object must be updated. An updating is also necessary, when the device receives new functionalities, which could not be accessed via the device object present until now.

Problematic is the integration of updated device objects into object-oriented configuration systems when main objects are being used. One possibility is to produce an updated device object and also a correspondingly updated main object. This means, however, a considerable test effort, since not only the updated device object must be tested, but, also, all other device objects of the relevant main object.

Another possibility is to generate, for the updated device object, an updated main object and to remove the not-updated device object from the original main object. There arises, along with the original device object, a completely independent device object. This, however, changes the modular structure of the configuration system and the user must institute considerable adaptations in its system.

Both alternatives mean for the operation of an object-based configuration system, in the case of updating of device objects, a considerable effort, either on the part of the device manufacturer or on the part of the user.

SUMMARY OF THE INVENTION

An object of the invention is, therefore, to provide a method for operating an object-based communication system for field devices of automation technology that does not have the above listed disadvantages and, especially, enables a simple integration of updated device objects.

This object is achieved by providing a first main object (MO-1), which makes available a first object set (OS-1), with device objects for a plurality of device types; instantiating, with the help of a first control engine, via an identifier (ID), device objects of the first set, in order to produce device managers for its field device types; providing, besides the first main object (MO-1), a second main object (MO-2), which has a second object set (OS-1), wherein individual device objects of the second object set (OS-2) are updated device objects of the first object set (OS-1); providing, between the frame application (FA) and the main object(s) (MO-1, MO-2), respectively) an intermediate level 1, which, via a second control engine, selects that main object which makes available updated device objects for a selected device type; and following selection of a device type, transfers to the selected main object an identifier (ID) in order to instantiate a corresponding device object.

An essential idea of the invention is to provide two main objects, with one main object being responsible for the integration of updated device objects, and to insert between the main objects and a frame application necessary for the running of the main objects, an intermediate layer, via which the existing and updated device objects can be selected.

In this way, updated device objects can be easily integrated into configuration systems, without requiring for the device manufacturer a greater test effort and for the user no greater adaptations, because the modular structure of the system was retained.

BRIEF DESCRIPTION OF THE DRAWING

The invention will now be explained in greater detail on the basis of an example of an embodiment as set forth in the drawing, the figures of which show as follows.

DETAILED DESCRIPTION

Figure 1:
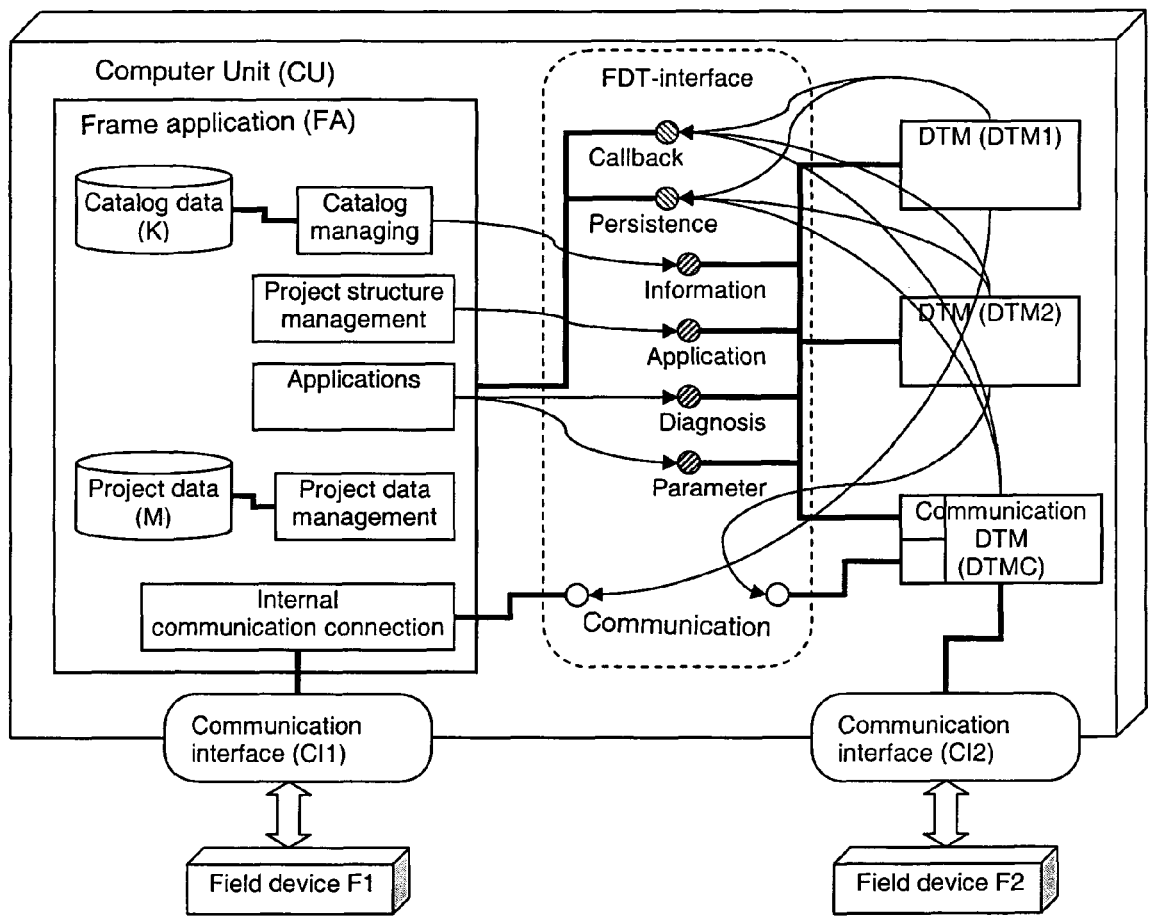
FIG. 1 is a basic structure of an object-oriented configuration system with a frame application and a plurality of device managers according to the FDT concept.

FIG. 1 shows, schematically, the basic structure of the FDT concept. A frame application FA, which runs on a computer unit CU, communicates via defined FDT-interfaces FDT with device manager instances DTM1, DTM2, which enable a comprehensive servicing of the field device types associated with the respective device managers. The frame application FA also communicates with the communication manager instance DTMC, which enables a comprehensive servicing of the interface. The frame application FA can be, for example, the product FIELDCARE® of the firm, Endress+Hauser. Frame application FA serves for, among other things, managing and instantiating various objects; in such case, the frame application is responsible for building the project structure, establishing connections between device- and communication-manager-instances, starting and managing applications, storing and loading project data, as well as production and destruction of projects.

For managing the project structure, each device manager and communication manager offers information via its Information interface. On the basis of this information, the frame application FA can accumulate catalog data K needed for managing the project structure. With the project structure, the frame application controls and manages also the communication paths. FIG. 1 shows two communication networks (e.g. fieldbuses), which are accessed via communication interfaces CI1, CI2. The device manager instances do not communicate with the field devices directly, but, instead, utilize the communication interface of FDT, which can be offered both by the frame application FA and also by a communication-manager instance. In FIG. 1, the device manager instance DTM1 communicates via a communication interface CI1 in the frame application FA with the field device F1 associated therewith, while the device manager instance DTM2 communicates with the field device F2 with the help of the communication-manager instance DTMC via a communication interface CI2. Frame application FA manages applications, which are part of the frame application, as well as also managing device manager- and communication manager-specific applications. Internal applications of the frame application FA, such as diagnostic methods and data registering, use the FDT interfaces for exchanging data with the device- and communication-manager-instances. Device manager- and communication manager-specific applications are managed by the frame application by means of an Application interface. The frame application queries, for this purpose, via an Information interface, type and number of the available applications.

The persistence of the project data is implemented by the frame application FA with the help of a Persistence interface, which are served by the device- and communication-manager instances.

Frame application FA forms, together with the device manager instances DTM1, DTM 2 and the communication manager instance DTMC, etc., an object-based configuration system CS for field devices of automation technology.

As already mentioned, the field device manufacturers make device managers available for their individual field devices. Before a field device can be accessed, the corresponding device manager, with all belonging objects, must be instantiated.

Figure 2A:
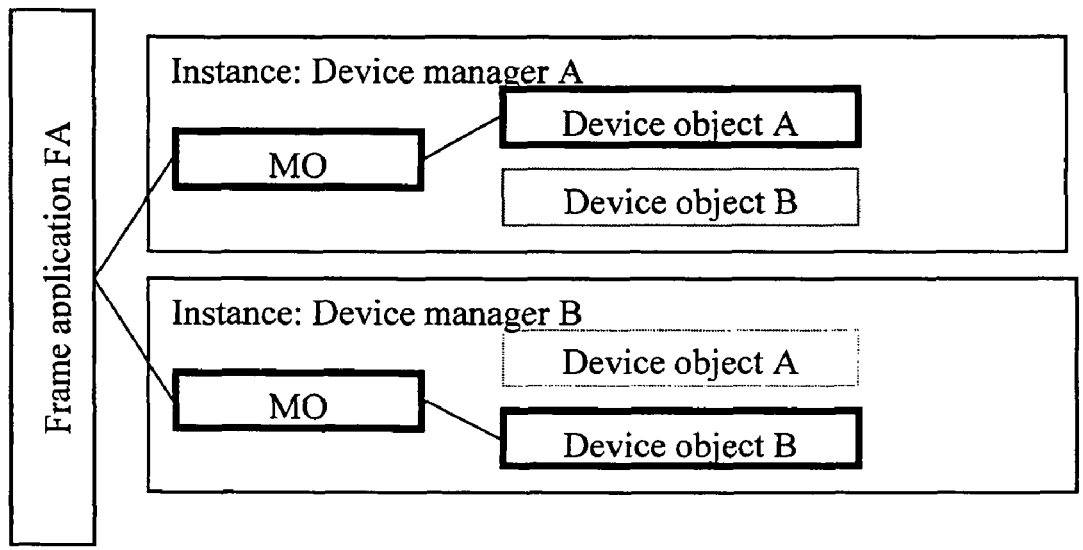
FIG. 2a is a frame application with a plurality of instantiated device managers, which are derived from a main object.

FIG. 2a shows the frame application FA with two instantiated device managers A and B. Associated with each device manager is exactly one field device type. The instantiation of the device managers occurs by interaction between frame application FA and user. If the user wants to integrate a certain field device into its project, then it accesses, via the frame application FA, a list with all field device types registered in a device catalog K. From this list, it can select a certain field device type (e.g. Deltabar S, of the firm Endress+Hauser).

With the help of a corresponding identifier ID (Deltabar S), which is forwarded by the frame application FA to a main object MO, the main object instantiates the corresponding device object. For this, the main object MO has a factory mechanism.

The main object MO makes available an object set OS with a plurality of device objects for respective device managers. The object set OS can comprise e.g. all field device types supported by Endress+Hauser.

With the help of the main object MO, yet a plurality of other device objects can be instantiated. FIG. 2a shows explicitly only one other instantiated device object B. The main object MO and the device object A form, together, the device manager A for the field device A.

Figure 2B:
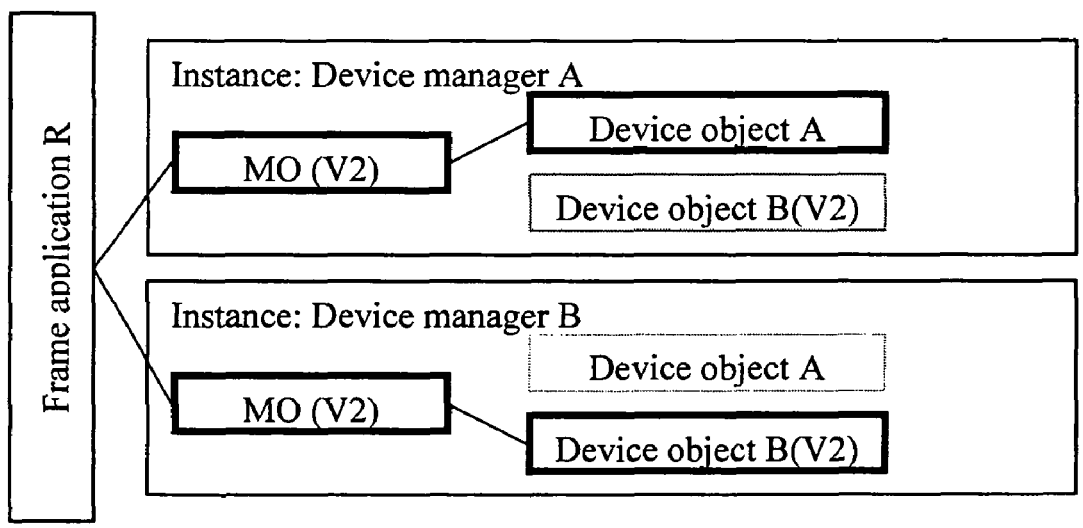
FIG. 2b is a frame application with two instantiated device managers, which are derived from an updated main object, with one of the device objects being an updated device object.

In FIG. 2b, a first alternative is shown for how an updated device object can be integrated into the configuration system CS. To this end, an updated main object MO and an updated software of the device object needs to be made available by the field device manufacturer. The updated object versions are indicated in each case by the version number V2.

The updated version of the main object MO(V2) is installed into the computer unit CU and replaces, thus, the old version of the main object MO, which is then no longer available.

With the main object MO being replaced by a new version, implicitly also all instantiated device managers, which do not represent the device type B, change. This alternative for integrating an updated device object requires on the part of the manufacturer of the main object a considerable test effort, since not only the device manager for the device type B must be tested, but also the device managers for all other device types supported by main object MO(V2). This test effort is especially difficult to provide, when device objects can be variably added.

Figure 2C:
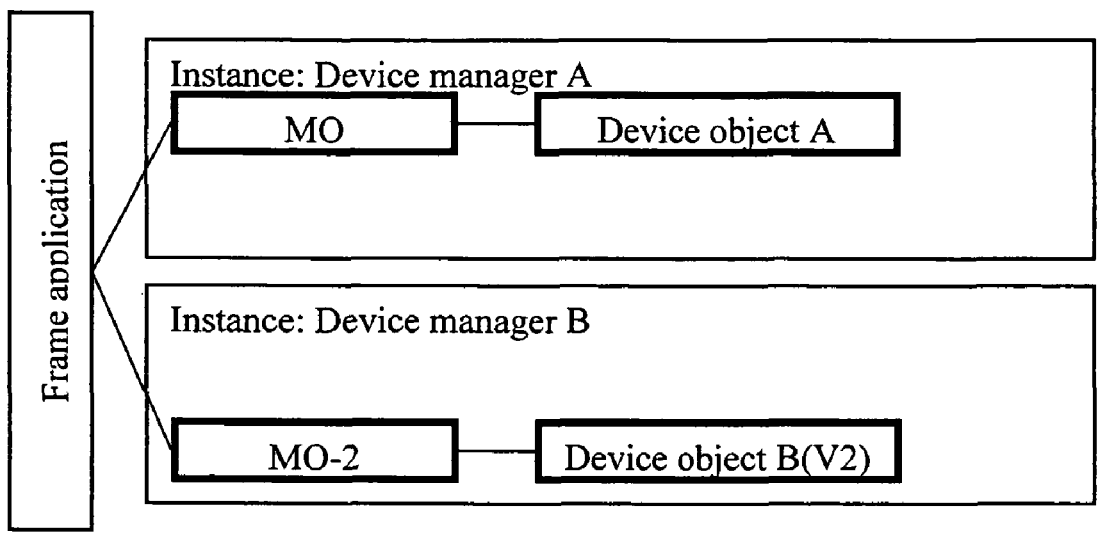
FIG. 2c is a frame application with two instantiated device managers, which are derived from different main objects, with one device object being updated.

FIG. 2c shows a second alternative for how a changed device object can be integrated into the configuration system CS.

For this, another main object MO-2 is produced, which is responsible for the instantiation of the updated device object B and contains the device object B in its object set OS-2. Device object B is, in such case, removed from the object set OS-1 of the main object MO.

The unchanged device objects are still instantiated via the original main object MO.

In the case of this alternative, two completely independent device managers A and B arise. A mutual influencing of the device managers is consequently no longer possible. However, the modular structure of the communication system CS changes fundamentally. Projects which contain the original device manager for device type B, can no longer, or only partially, be loaded and all device managers for the device type B must be manually exchanged, since no rules are known to the frame application FA for automatically bringing about this exchange. All data of the original device manager instances are, in such case, lost. Depending on number and dataset size of the originally instantiated device managers, a considerable configuration effort is necessary for the user, in order to effect this exchange.

Figure 3A:
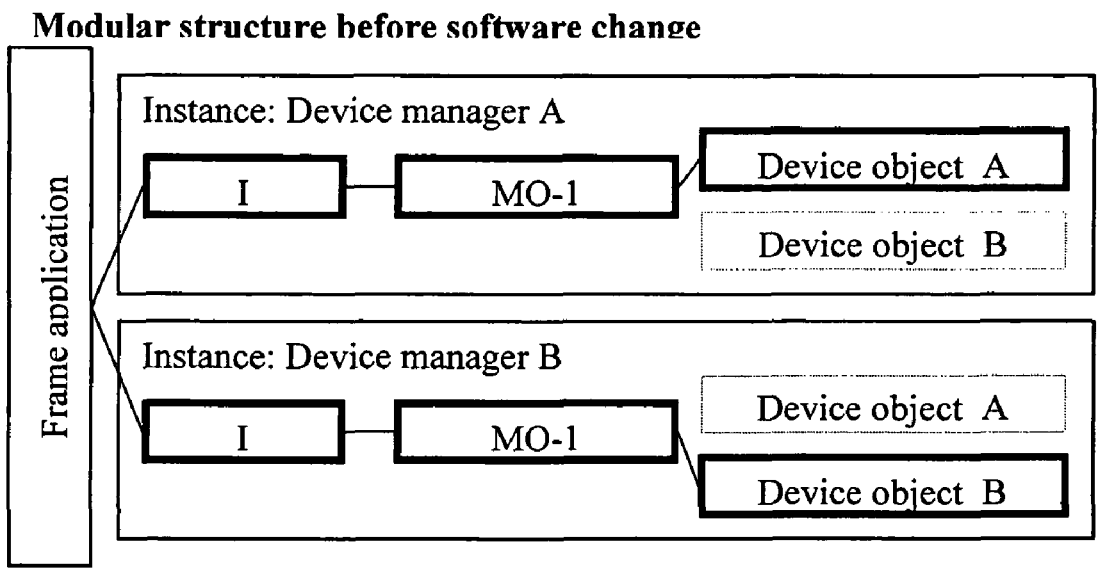
FIG. 3a is a frame application with two instantiated device managers according to the present invention.

FIG. 3a shows the solution of the invention in greater detail. Between the frame application FA and the main object MO-1, an intermediate layer I is inserted. The situation here corresponds to essentially to the situation in FIG. 2a, except for the intermediate layer.

Figure 3B:
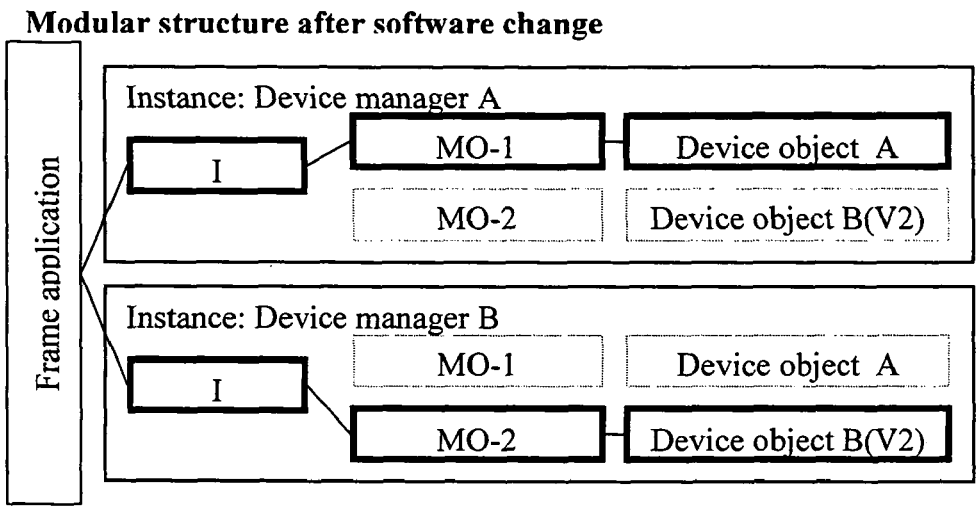
FIG. 3b is a frame application with two instantiated device managers according to the present invention, with one device object being updated.

FIG. 3b shows how an updated device object is integrated into the configuration system CS. For the updated device object B, an additional, second main object MO-2 must be produced.

The intermediate layer I decides which device object is instantiated via which main object.

If the user selects device A with the identifier ID(A), then the main object MO-1 and the device object A is instantiated.

If the user selects device B with the identifier ID(B), then, via the intermediate layer I, the main object MO-2 and the current device object B instantiated.

Now, two device managers A and B are present, with the device manager B containing the updated software version for the device object B. In this case, nothing changes in the modular structure of the object-based configuration system CS. As a result, also no configuration effort is necessary in the frame application FA. The frame application FA does not notice at all that a changed software object B was instantiated. An essential advantage resulting from this is an extremely lessened test effort. The influencing of the participating components is likewise minimal. Moreover, the integration effort required for a changed device object is minimal.

Figure 4:
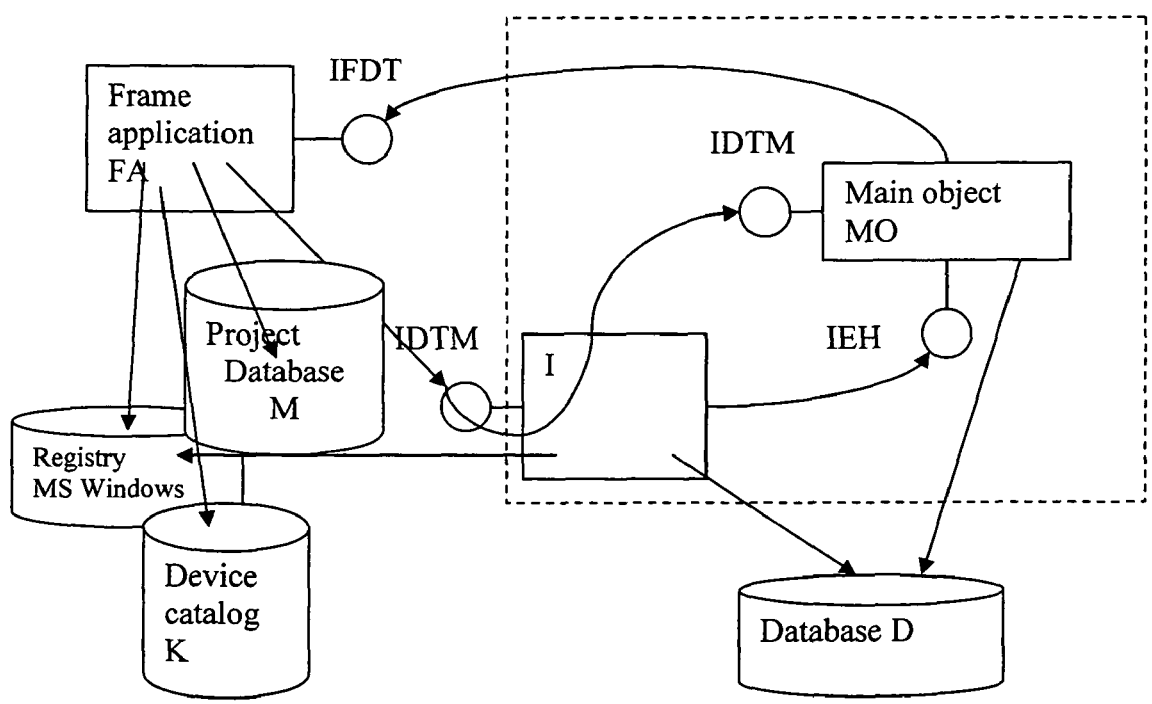
FIG. 4 illustrates the interface concept between the frame application FA, on the one hand, and the intermediate layer I and the main object MO, respectively, on the other hand.

FIG. 4 shows the interface concept between frame application FA, on the one hand, and intermediate layer I and main object MO, respectively, on the other hand. Available to the frame application FA is the device catalog with a plurality of device types. In the case of designing a project, the user brings various devices into its project. The corresponding project data are stored in the project data memory M. The frame application FA can, of course, also access the Microsoft Windows Registry. The intermediate layer I has a DTM-interface IDTM, via which the frame application FA accesses the intermediate layer I. The main object MO has, likewise, a corresponding DTM-interface IDTM. Additionally, the main object MO includes a proprietary interface IEH. Via this proprietary interface, the intermediate layer I can access the main object MO. The allowed constellations between intermediate layer I and the main objects and their device objects is determined by a database D, which can be implemented, for example, by the Microsoft Windows registry. Requests from the frame application FA are forwarded via the intermediate layer I to the main object MO. For instantiating a device manager for a device type ID, the intermediate layer ascertains, with the help of the database D, which main object, MO1 or MO2, is to be instantiated, in order to represent the device type of identifier ID, and instantiates correspondingly. Via the proprietary interface IEH, the intermediate layer I initializes the main object MO1, respectively MO2, and forwards therewith the identifier ID. The main object MO1, MO2, respectively, ascertains, on the basis of the database D, the device object matching the device type with the identifier ID and instantiates such.

We claim:

1. A method for operating an object-based configuration system (CS) for field devices of automation technology, with a frame application (FA) which runs on a computer (CU), the frame application (FA) serving for managing and instantiating a plurality of objects, wherein to individual groups of device-objects are assigned field device types, which enable, as device managers, a configuration of a corresponding field device type, comprising the steps of:
    providing a first main object (MO-1) from a device manager (A), which makes available a first object set (OS-1) with device objects for a plurality of device types;
    instantiating, with the help of a first control engine, via an identifier (ID), device objects of the first object set, in order to produce device managers for its field device types;
    providing besides the first main object (MO-1), a second main object (MO-2) from a device manager (B), which has a second object set (OS-2), wherein individual device objects of the second object set (OS-2) are updated device objects of the first object set (OS-1);
    providing, between the frame application (FA) and the main object(s) (MO-1, MO-2, respectively) an intermediate layer I, which, via a second control engine, selects that main object which makes available updated device objects for a selected device type; and
    following selection of a device type, transfers to the selected main object via an interface, an identifier (ID), in order to instantiate a corresponding device object.

2. A method as claimed in claim 1, wherein:
the object-based configuration system corresponds to an FDT object model.

3. The method as claimed in claim 1, wherein:
requests are forwarded transparently between frame application (FA) and main object (MO-1, MO-2).

4. The method as claimed in claim 1, wherein:
the intermediate layer (I) is responsible only for instantiating the main objects (MO-1, MO-2).

* * * * *